United States Patent [19]

Shimizu et al.

[11] Patent Number: 5,027,088
[45] Date of Patent: Jun. 25, 1991

[54] SIGNAL WIRING BOARD

[75] Inventors: Fumihiko Shimizu, Yokohama; Taro Shibagaki, Tokyo, both of Japan

[73] Assignee: Kabushiki Kaisha Toshiba, Kawasaki, Japan

[21] Appl. No.: 490,058

[22] Filed: Mar. 7, 1990

[30] Foreign Application Priority Data

Mar. 14, 1989 [JP] Japan .................. 1-61640

[51] Int. Cl.$^5$ ............................... H01P 3/08
[52] U.S. Cl. ......................... 333/1; 333/238
[58] Field of Search ............ 333/1, 238; 174/34, 174/36, 117 FF, 117 PC

[56] References Cited

U.S. PATENT DOCUMENTS 4,045,750  8/1977  Marshall .................. 174/36 X
4,441,088  4/1984  Anderson ................... 333/1

FOREIGN PATENT DOCUMENTS 63-61815  11/1988  Japan .
63-61816  11/1988  Japan .

OTHER PUBLICATIONS

John D. Crow et al., "A GaAs MESFET IC for Optical Multiprocessor Networks", IEEE Transactions on Electron Devices, vol. 36, No. 2, pp. 263-268 (1989).

Primary Examiner—Paul Gensler
Attorney, Agent, or Firm—Oblon, Spivak, McClelland, Maier & Neustadt

[57] ABSTRACT

A signal wiring board of the present invention includes a dielectric layer and a signal transmission path formed on a surface opposite to a surface of a ground layer formation surface on the board. The signal transmission path is composed of a pair of differential transmission lines which in turn is formed of a microstrip. Differential signals of opposite polarities are transmitted through the paired transmission lines on the signal transmission path such that electric currents of opposite senses flow through the paired differential transmission lines, respectively. With the electric currents there being a positive and a negative polarity, electric lines of force are also created between the transmission lines. The electric lines of force are strengthened as a gap G becomes narrower. The transmission lines are such that a relation $G<H<S$ is satisfied where G represents the gap G between the differential transmission lines, S a distance between the adjacent signal transmission on the signal transmission path lines and H a thickness of the dielectric layer.

2 Claims, 7 Drawing Sheets

SIGNAL WIRING BOARD

BACKGROUND OF THE INVENTION

1. Field of the Invention

The present invention relates to a signal wiring board for transmitting many channel signals and to an improved signal wiring board which can suppress a crosstalk between channels during the transmission of such channel signals.

2. Description of the Related Art

Figure 1:
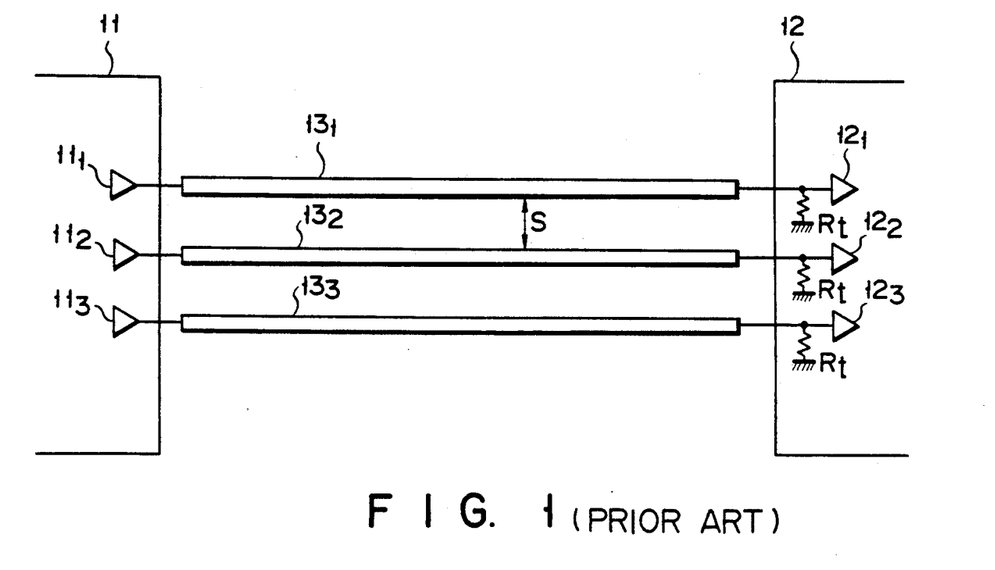
FIG. 1 is a block diagram showing a circuit arrangement of a conventional signal wiring board.

FIG. 1 shows a conventional circuit arrangement for simultaneously transmitting a large number of high-speed channel signals over a signal wiring board from transmission section to a reception section. When, in FIG. 1, the respective channel outputs of transmitter circuits $11_1$ to $11_3$ in a transmission section 11 are transmitted to corresponding receiver circuits $12_1$ to $12_3$ in the reception section 12, the outputs of the transmitter circuits $11_1$ to $11_3$ are connected, for the respective channels, to the inputs of the corresponding receiver circuits $12_1$ to $12_3$ by corresponding signal transmission paths $13_1$ to $13_3$ having a characteristic impedance $Z_0$ with respect to ground and a terminating resistor $R_t$ equal in value to the characteristic impedance $Z_0$ is connected to a corresponding input terminal of the respective receiver circuits $12_1$ to $12_3$. According to the aforementioned circuit arrangement, it is possible to reduce a reflection in the respective channel of the reception section 12 by the terminating resistor $R_t$ and to perform a better signal transmission. This advantage is also obtained if the number of channels is increased.

Figure 2:
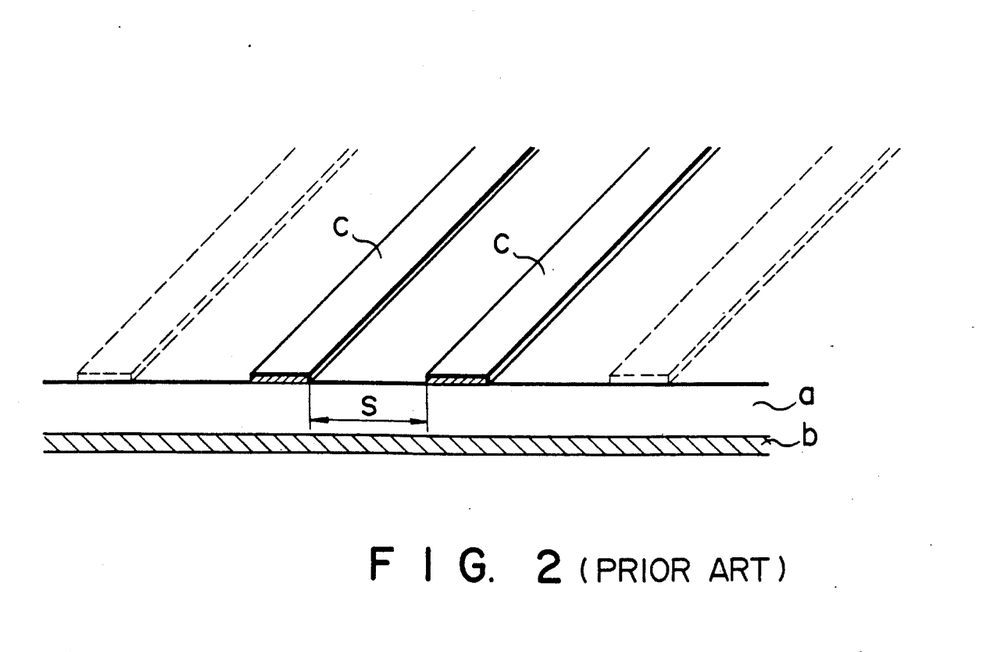
FIG. 2 is a perspective view, partly in cross-section, showing a structure of FIG. 1.
Figure 3:
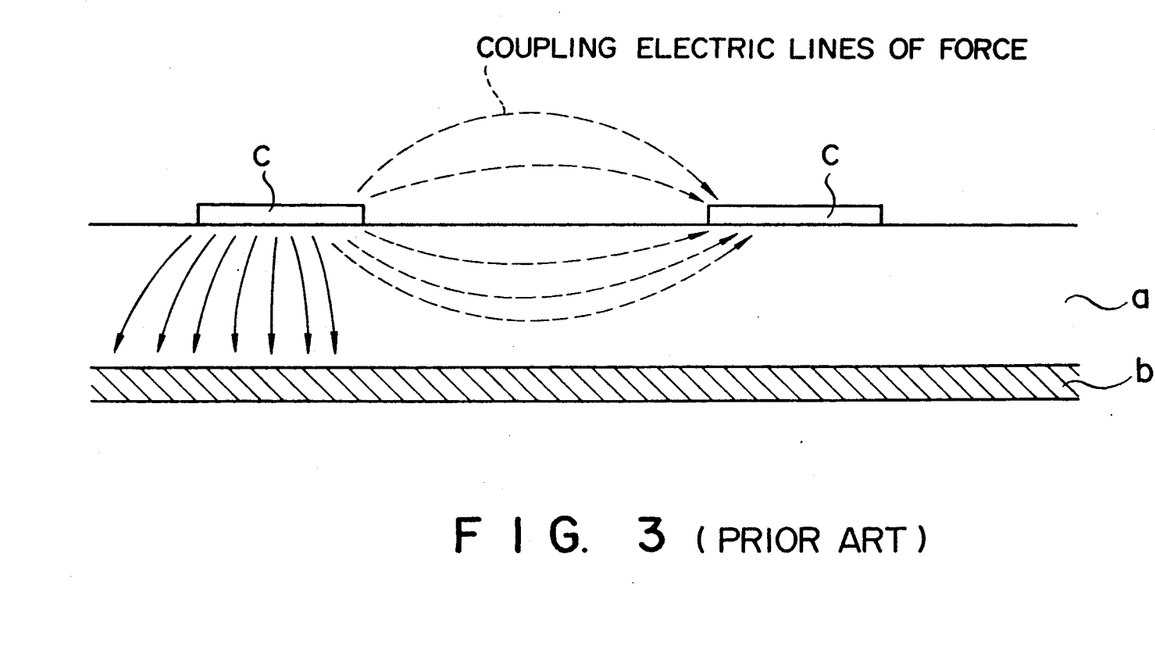
FIG. 3 is a cross-sectional view for explaining the operation of the conventional signal wiring board of FIG. 1.

A transmission path formation on the aforementioned signal wiring board has a structure as shown in FIG. 2. In the arrangement shown in FIG. 2, a shows a dielectric layer; b, a ground layer and c, a respective signal transmission path formed of a microstrip. This structure poses no problem upon the transmission of a signal of a relatively low frequency, but cross-talk is increased between the adjacent transmission paths due to the transmission of a high-speed signal on a high-density packaged board. That is, if a distance S between the signal transmission paths is narrowed, electric lines of force are created between the adjacent transmission paths, thus increasing cross-talk there. A degraded signal on transmission results. This degradation is prominently produced upon the transmission of a high-speed signal. For this reason, the transmission of a high-speed signal as well as the implementation of a high-density unit becomes difficult on the conventional structure.

For the conventional signal wiring board as set forth above, it has been difficult to suppress cross-talk which is increased due to the transmission of a high-speed signal as well as the implementation of a high density unit.

SUMMARY OF THE INVENTION

It is accordingly the object of the present invention to provide a signal wiring board which can be formed as a compact, high-speed unit whereby it is possible to suppress cross-talk which would occur due to the implementation of a high packing density board and to the transmission of a high-speed signal on that board. It is thus possible to provide a compact signal wiring board capable of high-speed signal transmission.

According to the present invention, there is provided a signal wiring board including a dielectric substrate having a ground layer formed on one surface and a plurality of signal transmission paths formed on the other surface and running in parallel with each other, comprising transmission path forming means composed of the plurality of signal transmission paths, each, having a pair of differential transmission lines and running in parallel with each other, the respective transmission lines being so provided as to satisfy a relation:

$$G < H < S$$

where

G: a gap of a pair of differential transmission lines;
S: a distance between the adjacent signal transmission paths; and
H: a thickness of the dielectric substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrates presently preferred embodiments of the invention and, together with the general description given above and the detailed description of the preferred embodiments given below, serve to explain the principles of the invention.

DETAILED DESCRIPTION OF THE PREFERRED EMBODIMENT

A signal wiring board according to an embodiment of the present invention will be explained below with respect to FIGS. 4 to 10.

Figure 5:
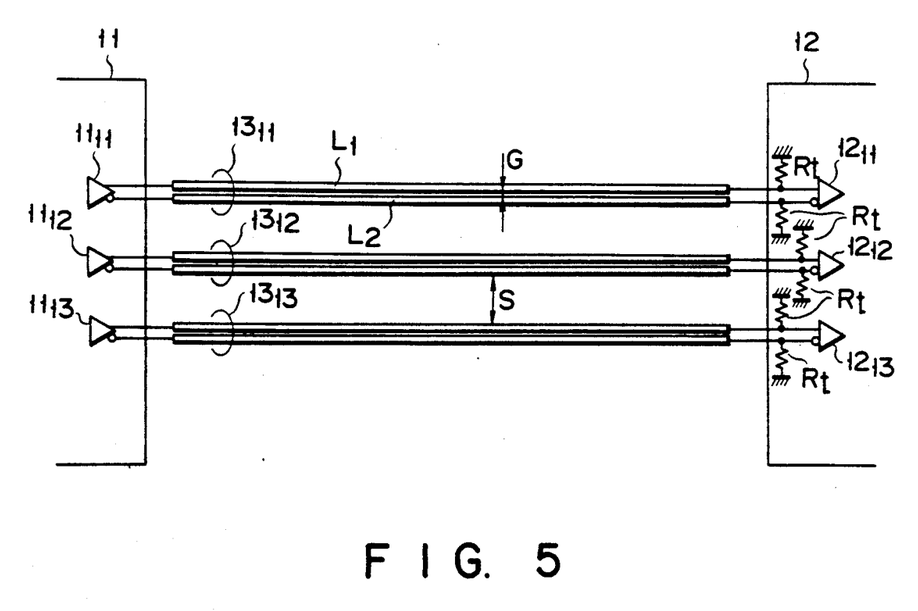
FIG. 5 is a block diagram showing the signal wiring board of FIG. 4.

FIG. 5 is a circuit diagram showing a signal transmission circuit on a signal wiring board to which the present invention is applied. In FIG. 5, identical reference numerals are employed to designate parts or elements corresponding to those shown in FIG. 1 and any further explanation is, therefore, omitted for brevity's sake.

First, transmitter circuits, $11_{11}$ to $11_{13}$ of a transmission section 11, each, deliver a pair of differential signals of opposite polarities and receiver circuits $12_{11}$ to $12_{13}$ of a reception section 12, each, have a corresponding pair of differential input terminals. The differential output terminals of the transmitter circuits $11_{11}$ to $11_{13}$ are connected to the corresponding differential input terminals of the receiver $12_{11}$ to $12_{13}$ by differential transmission paths $13_{11}$ to $13_{13}$ with a pair of transmission lines $L_1$, $L_2$ on each channel signal transmission path run parallel to each other and having a characteristic impedance $Z_0$ with respect to ground. A terminal resistor $R_t$ equal in value to the characteristic impedance $Z_0$ is connected to the respective input terminals of the receiver circuits $12_{11}$ to $12_{13}$.

Figure 4:
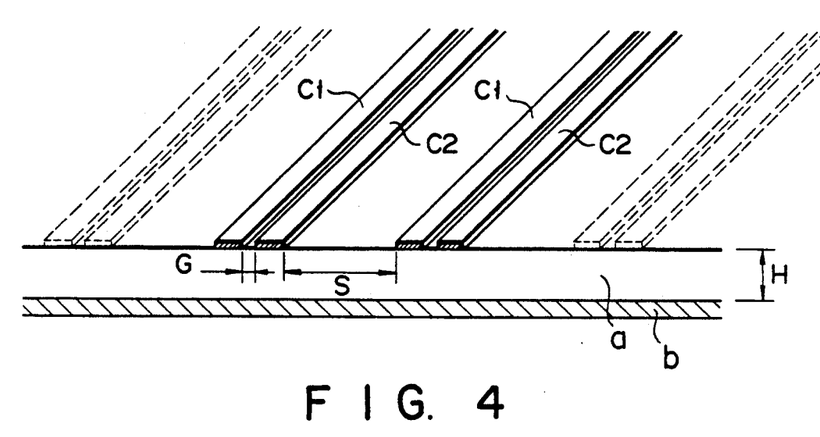
FIG. 4 is a perspective view, partly in cross-section, showing a signal wiring board according to one embodiment of the present invention.

FIG. 4 shows an arrangement of a transmission path formation on the signal wiring board of the aforementioned circuit structure. In FIG. 4, a and b show a dielectric layer and ground layer, respectively, and $C_1$, $C_2$ show the transmission lines ($L_1$, $L_2$) on the differential transmission paths $13_{11}$ to $13_{13}$ which are formed of microstrips. The transmission lines $C_1$, $C_2$ are so set as to satisfy a relation:

$$G < H < S$$

where
G: a gap of a pair of differential transmission lines;
S: a distance between the adjacent signal transmission paths; and
H: a thickness of the dielectric layer.

The operation of the aforementioned signal wiring board will be explained below.

Figure 6:
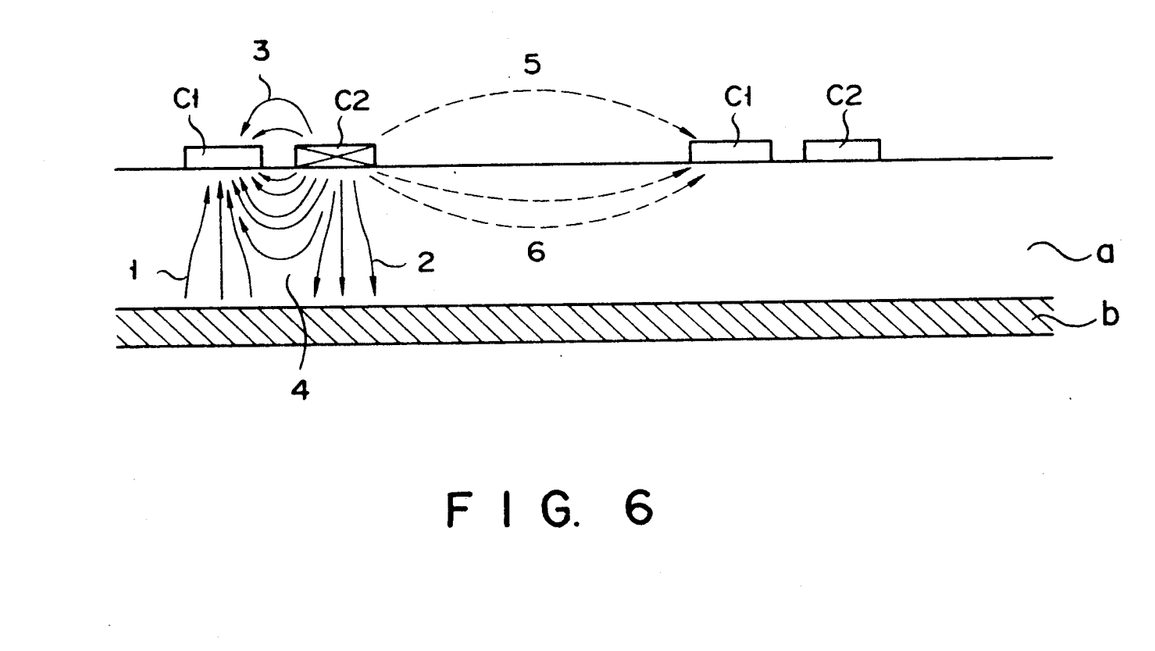
FIG. 6 is a cross-sectional view for explaining the operation of the embodiment of FIG. 4.

FIG. 6 is a cross-sectional, enlarged view showing an arrangement similar to that of FIG. 4. Since differential signals of opposite polarities are transmitted to the corresponding transmission lines $C_1$, $C_2$ on the respective channel signal transmission path, their currents flow in opposite directions. If the currents flow in the direction indicated in FIG. 6 with the transmission paths $C_1$ and $C_2$ representing a positive and a negative polarity, respectively, electric lines 1 and 2 of force are created between the transmission lines $C_1$, $C_2$ and a ground layer b and electric lines 3 and 4 of force are created between the transmission lines $C_1$ and $C_2$. The electric lines 3 and 4 of force become stronger as the gap of a differential transmission lines $C_1$ and $C_2$ become narrower.

It is possible to reduce electric lines 5 and 6 of force between the adjacent transmission paths by making the gap G adequately narrower than the distance S between the adjacent transmission paths and than the thickness H of the dielectric layer a and thus increasing the electric lines 3 and 4 of force. That is, the gap G between the paired transmission lines $C_1$ and $C_2$ is determined so that the number of electric lines 3 and 4 of force caused between transmission lines $C_1$ and $C_2$, when differential signals whose polarities are opposite to each other are supplied to transmission lines $C_1$ and $C_2$ of a channel signal transmission path, is larger than that of electric lines 5 and 6 caused between transmission line $C_2$ and one of $C_1$ and $C_2$ of another channel signal transmission path which is adjacent to the channel signal transmission path.

Even if the distance S between the adjacent transmission path is decreased so as to implement a high packing density board, it is possible to confine electric lines of force within a common channel between the transmission lines $C_1$, $C_2$ if the gap G is minimized. The coupling of the electric lines of force which may cause cross-talk between the mutually adjacent signal transmission paths can remarkably be suppressed upon comparison with that in the conventional case.

The advantages of the signal wiring board will be explained below with reference to FIGS. 7 to 10.

Figure 7:
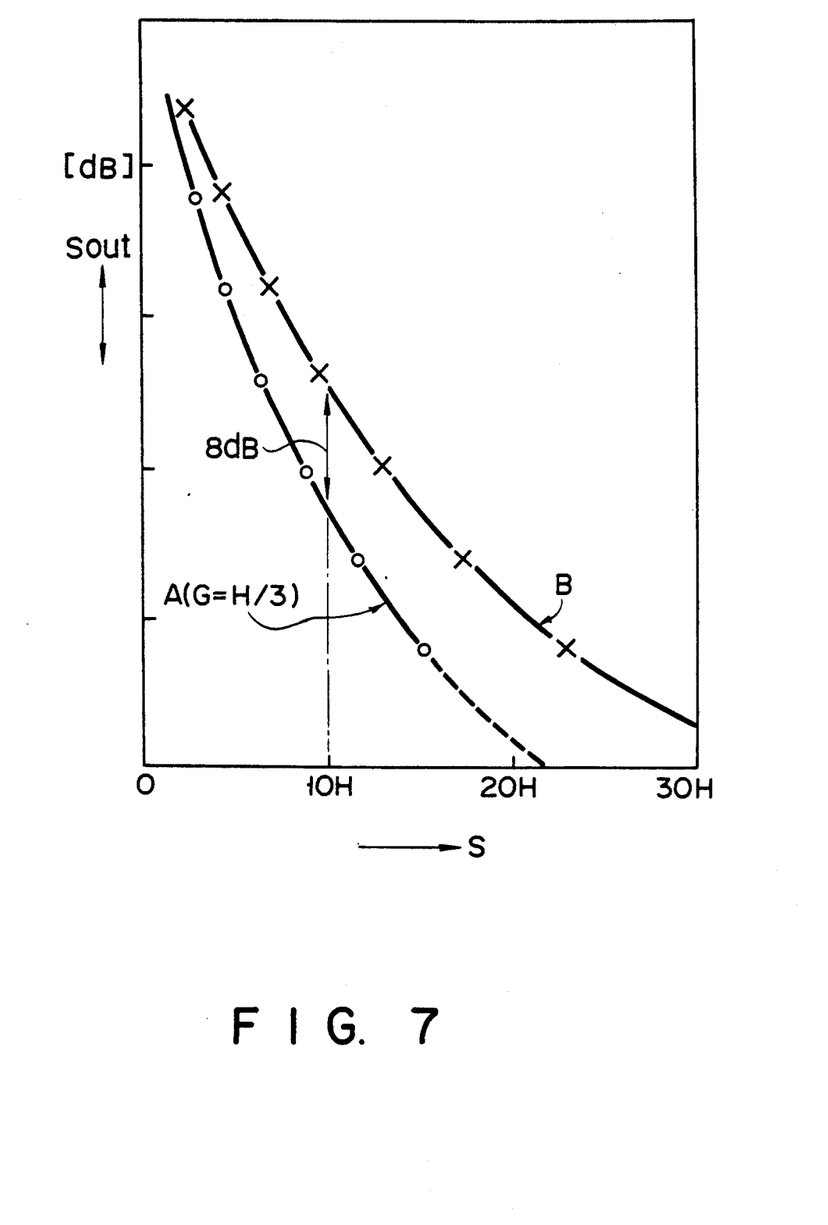
FIG. 7 is a characteristic curve for explaining of the embodiment of FIG. 4.
Figure 8:
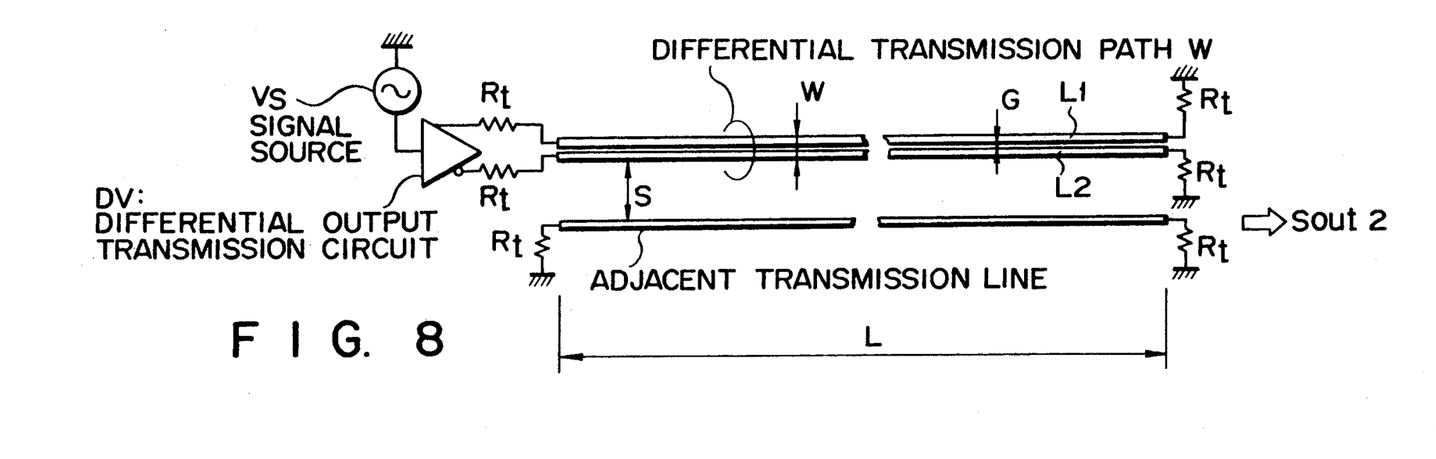
FIGS. 8 and 9, each, show board parameters for evaluating the characteristic of FIG. 7.
Figure 9:
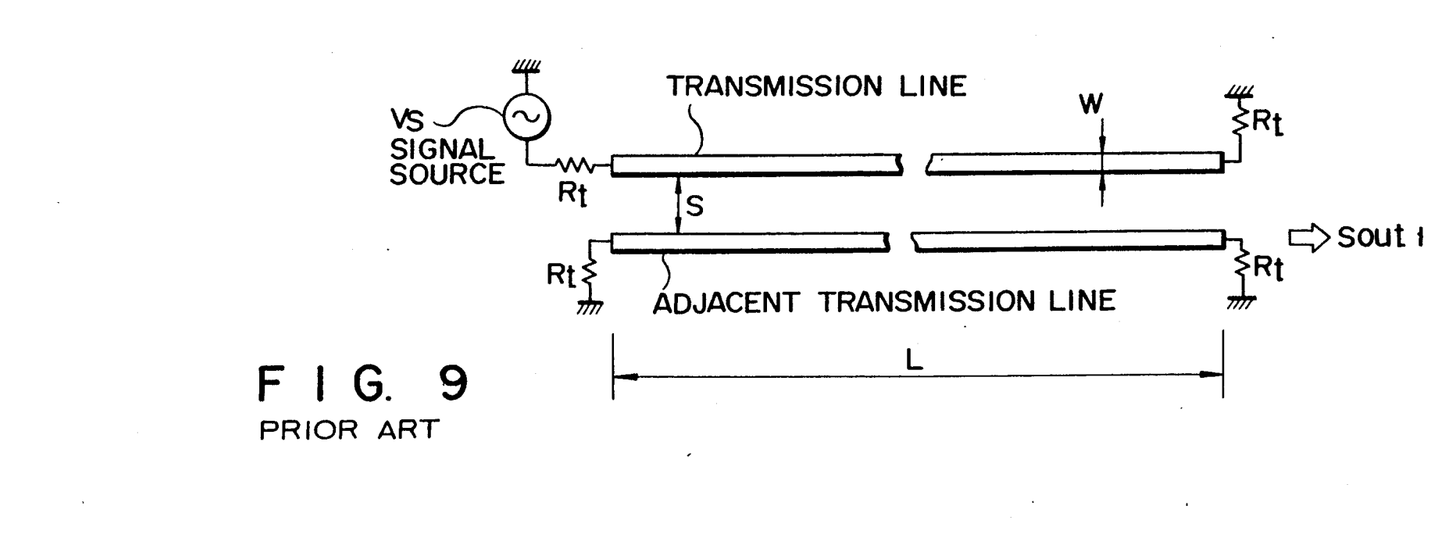

FIG. 7 shows a relation of a path-to-path distance S to cross-talk amount $S_{out}$ when a conventional circuit as shown in FIG. 9 and a circuit of the present invention as shown in FIG. 8 are formed on an ordinary glass epoxy resin substrate of a thickness H. In FIGS. 8 and 9, VS and DV represent a signal source and differential output transmitter circuit, respectively. In either case, the width W of the channel signal transmission path as shown in FIG. 8 is equal to the width W of the signal transmission lines as shown in FIG. 9 and, in either case, the channel signal transmission lines have a length L and a characteristic impedance $Z_0\ \Omega$ to ground. In FIG. 7, a variation of cross-talk amount $S_{out}$ of a 1 GHz signal with respect to the path-to-path distance S is plotted at $L \gg H$ and $G = H/3$, noting that A and B represent a circuit arrangement shown in FIG. 8 and that shown in FIG. 9 respectively. From FIG. 7 it will be seen that it is possible to reduce the cross-talk amount when the transmission path structure is formed of differential transmission lines.

Figure 10:
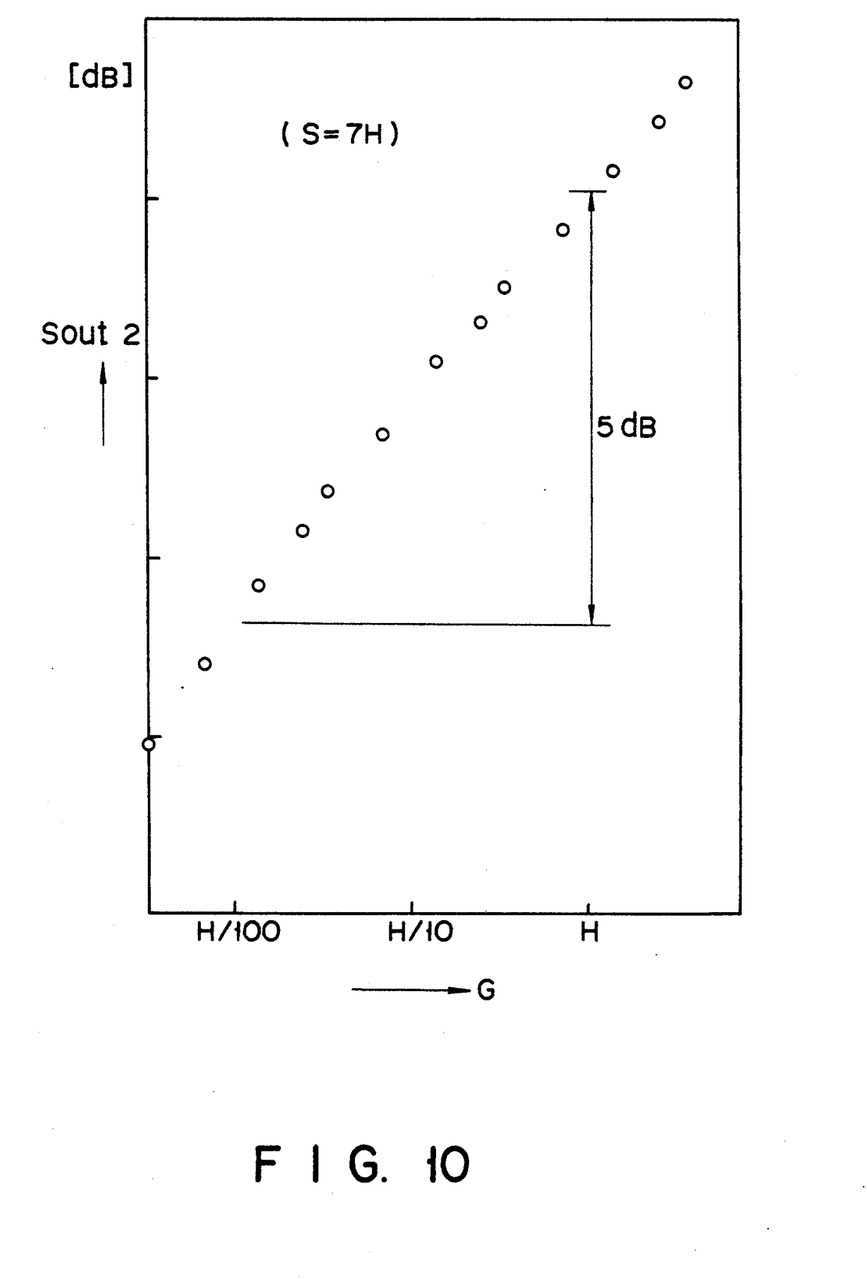
FIG. 10 is a characteristic curve showing a relation of a cross-talk amount to gap width as defined in the embodiment of the present invention.

FIG. 10 shows a cross-talk characteristic on a differential signal transmission path, formed of a pair of transmission lines having a gap G therebetween, in which case under the condition of FIG. 7 the path-to-path distance S has been set to, for example, 7H with the gap width G narrowed. From FIG. 10 it will be evident that the cross-talk amount $S_{out2}$ becomes suppressed if the gap G between the differential transmission paths is decreased relative to the channel-to-channel distance S.

Since, in the aforementioned signal wiring board, the transmission path is composed of differential transmission lines and the gap G is made adequately narrower than the adjacent path-to-path distance S, it is possible to suppress a cross-talk amount which would otherwise be increased on a high-packing density board of high-speed type and hence to achieve a compact, high packing density board capable of high-speed signal transmission. Since differential signals flow through the transmission paths, the board thus achieved is less immune to an extraneous noise.

Although the aforementioned transmission and reception sections are shown by way of example, they do not constitute one important feature of the present invention. Input and output terminals of a proper circuit may of course be connected to the board for a proper purpose. Further, the transmission lines may be composed of not only microstrip lines but also other proper strip lines. Even in this case, the board of the present invention can be achieved having an advantage as set forth above.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:
1. A signal wiring board comprising:
a dielectric substrate;
a ground layer formed on one surface of the dielectric substrate; and a plurality of signal transmission paths formed on the other surface of the dielectric substrate and running in parallel with each other, a pair of differential transmission lines being provided for each signal transmission path and running in parallel with each other;

wherein the respective transmission lines are provided as to satisfy a relation:

$$G < H < S$$

where
- G: a gap between a pair of differential transmission lines;
- S: a distance between adjacent signal transmission paths; and
- H: a thickness of the dielectric substrate.

2. A signal wiring board comprising:

a dielectric substrate;

a ground layer formed on one surface of the dielectric substrate; and a plurality of signal transmission paths formed on the other surface of the dielectric surface and running in parallel with each other, each of said paths including a pair of differential transmission lines running in parallel with each other in which a gap between a respective pair of differential transmission lines is so set that, upon flow of differential signals opposite in a current direction to each other in respective ones of said pair of differential transmission lines, the number of electric lines of force created between the pair of differential transmission lines is greater than that created between the pair of differential transmission lines and an adjacent pair of differential transmission lines on an adjacent signal transmission path.

* * * * *